US008237296B2

(12) United States Patent
Hancer

(10) Patent No.: US 8,237,296 B2
(45) Date of Patent: Aug. 7, 2012

(54) SELECTIVE UV-OZONE DRY ETCHING OF ANTI-STICTION COATINGS FOR MEMS DEVICE FABRICATION

(75) Inventor: Mehmet Hancer, Wilmington, MA (US)

(73) Assignee: Analog Devices, Inc., Norwood, MA (US)

( * ) Notice: Subject to any disclaimer, the term of this patent is extended or adjusted under 35 U.S.C. 154(b) by 136 days.

(21) Appl. No.: 12/796,162

(22) Filed: Jun. 8, 2010

(65) Prior Publication Data

US 2010/0314724 A1 Dec. 16, 2010

Related U.S. Application Data

(60) Provisional application No. 61/186,958, filed on Jun. 15, 2009.

(51) Int. Cl.
*H01L 23/29* (2006.01)
(52) U.S. Cl. ......... 257/791; 257/E21.088; 257/E21.261; 438/598; 427/595; 134/1.3
(58) Field of Classification Search .................. None
See application file for complete search history.

(56) References Cited

U.S. PATENT DOCUMENTS

| | | | | |
|---|---|---|---|---|
| 5,962,079 | A | 10/1999 | Koberstein et al. | 427/508 |
| 6,316,059 | B1 * | 11/2001 | Van Der Putten et al. | 430/29 |
| 2006/0113618 | A1 | 6/2006 | Reboa | 257/415 |
| 2007/0115530 | A1 | 5/2007 | Chen et al. | 359/290 |
| 2007/0241417 | A1 * | 10/2007 | Huibers et al. | 257/436 |
| 2007/0281492 | A1 | 12/2007 | Chinn et al. | 438/725 |
| 2008/0111203 | A1 * | 5/2008 | Pan et al. | 257/415 |

FOREIGN PATENT DOCUMENTS

EP 0577187 1/1994

OTHER PUBLICATIONS

International Searching Authority, International Search Report for International Application No. PCT/US2010/037735, dated Feb. 25, 2011, together with the Written Opinion of the International Searching Authority, 9 pages.

* cited by examiner

*Primary Examiner* — Benjamin Sandvik
*Assistant Examiner* — Scott R Wilson
(74) *Attorney, Agent, or Firm* — Sunstein Kann Murphy & Timbers LLP

(57) ABSTRACT

Organic anti-stiction coatings such as, for example, hydrocarbon and fluorocarbon based self-assembled organosilanes and siloxanes applied either in solvent or via chemical vapor deposition, are selectively etched using a UV-Ozone (UVO) dry etching technique in which the portions of the organic anti-stiction coating to be etched are exposed simultaneously to multiple wavelengths of ultraviolet light that excite and dissociate organic molecules from the anti-stiction coating and generate atomic oxygen from molecular oxygen and ozone so that the organic molecules react with atomic oxygen to form volatile products that are dissipated, resulting in removal of the exposed portions of the anti-stiction coating. A hybrid etching process using heat followed by UVO exposure may be used. A shadow mask (e.g., of glass or quartz), a protective material layer, or other mechanism may be used to selective expose the portions of the anti-stiction coating to be UVO etched. Such selective UVO etching may be used, for example, to expose wafer bond lines prior to wafer-to-wafer bonding in order to increase bond shear and adhesion strength, to expose bond pads in preparation for electrical or other connections, or for general removal of anti-stiction coating materials from metal or other material surfaces. One specific embodiment uses two wavelengths of ultraviolet light, one at around 184.9 nm and the other at around 253.7 nm.

19 Claims, 4 Drawing Sheets

SELECTIVE UV-OZONE DRY ETCHING OF ANTI-STICTION COATINGS FOR MEMS DEVICE FABRICATION

CROSS-REFERENCE TO RELATED APPLICATION(S)

This patent application claims the benefit of U.S. Provisional Patent Application No. 61/186,958 filed Jun. 15, 2009, which is hereby incorporated herein by reference in its entirety.

FIELD OF THE INVENTION

The invention generally relates to MEMS devices and, more particularly, the invention relates to selective etching of anti-stiction coatings in MEMS device fabrication using a UV-Ozone dry etching technique.

BACKGROUND OF THE INVENTION

Semiconductor technologies often form extremely clean microstructure surfaces on microelectromechanical devices (often referred to as "MEMS devices"). Undesirably, extremely clean microstructure surfaces often stick together if they come into contact.

When the surfaces remain stuck together, the device often is inoperable. This concept of surface sticking is known in the art as "stiction."

A number of different factors can contribute to stiction. For example, among other things, stiction can be caused by capillary, electrostatic, and van der Waals forces. In some cases, stiction can be caused by "chemical" forces, such as hydrogen bonding and solid bridging. Accordingly, prior to distribution of a MEMS device, MEMS device manufacturers often perform a variety of tests to determine the potential for stiction problems.

In order to combat stiction, the wafer surface may be coated with a thin anti-stiction coating having a low surface energy. Examples of common anti-stiction coatings include hydrocarbon and fluorocarbon based self assembled organosilanes and siloxanes applied either in solvent or via chemical vapor deposition. The anti-stiction coating typically covers the entire wafer surface including such things as bond lines used for wafer-to-wafer bonding (e.g., wafer capping or stacking) and bond pads for electrical and other connections.

MEMS devices are often sealed in hermetic enclosures by either putting each individual dies in hermetic packages, or encapsulating sensors in wafer level. Wafer level encapsulation can reduce package size and cost, and it has often been achieved by using seal glass (or glass frit) as an intermediary bonding layer. Although the seal glass bonding has been incorporated in many MEMS products, including accelerometers, it imposes several constraints including larger die size on the order of 100 micron, contamination of die enclosure during screen printing, and contamination from lead used to reduce the melting temperature of glass.

Other types of bonding, such as metal-to-metal, Si-to-Si, and Si-to-metal bonding, may be used as an alternative to seal glass bonding. Some examples include copper-to-copper, aluminum-to-aluminum, and aluminum/germanium-to-aluminum bonding using thermal compression bonding schemes. Such alternative bonding techniques typically allow for reduced bond line thickness, which can allow for more dies per wafer and hence lower cost per die.

After bonding the cap and device wafers together, the capped wafers are "singulated" or diced into individual capped devices. During singulation, the un-bonded areas between the caps (often referred to as "grid") becomes loose and after dicing, the grid is removed, e.g., by taping the cap wafer from the top and pulling off the grid. Quantitative bond yield and strength may then be evaluated, for example, by inspecting the grid to determine the percentage of bonded and un-bonded grid using a XYZTEC™ shear measurement tool.

Wafer-to-wafer bonding is typically done with the anti-stiction coating still intact and covering the bond lines, for example, using thermocompression bonding. However, the existence of the anti-stiction coating on the bond lines can negatively impact adhesion and can reduce the bond shear strength, which can result in an incomplete or insufficient wafer-to-wafer bond. These things can lower yield (i.e., the number of acceptable devices realized per wafer) and also can lead to device failures.

Plasma etching has been used to remove anti-stiction coating material from bond line surfaces, but plasma etching is generally non-selective and can result in removal of anti-stiction coating materials from movable MEMS structures that require stiction prevention.

SUMMARY

The invention generally relates to MEMS devices and, more particularly, the invention relates to selective etching of anti-stiction coatings in MEMS device fabrication using a UV-Ozone dry etching technique.

In certain embodiments, a MEMS fabrication method involves forming an organic anti-stiction material layer on a first wafer, the anti-stiction material layer covering at least one structure on the first wafer, heating the first wafer to remove anti-stiction material from a surface of the at least one structure, and exposing the first wafer to at least two wavelengths of ultraviolet light to remove additional anti-stiction material from the surface of the at least one structure through UV-ozone etching.

Exemplary organic anti-stiction coatings include hydrocarbon and fluorocarbon based self-assembled organosilanes and siloxanes. Exemplary embodiments expose the first wafer to two wavelengths of ultraviolet light including a wavelength of around 184.9 nm and a wavelength of around 253.7 nm. The structure from which the anti-stiction coating is etched may include a wafer bond line or bond pad, an electrode, or other metallic or other structure. The UV-ozone etching may involve masking, such as a shadow mask or a protective material formed on the anti-stiction material, including an arrangement of openings for selective exposure of the anti-stiction coating to the ultraviolet light.

The exposed structure surface may be bonded to a corresponding structure on a second wafer. The second wafer may be a cap wafer or second MEMS device wafer and may include electronic circuitry, and the corresponding structure may be a bond line, electrode, or other structure. Alternatively, a material layer may be formed on the exposed surface of the structure, or an electrical or other connection may be made to the exposed surface of the structure.

In exemplary embodiments, the first wafer may be heated at a temperature about 200-460 degrees C. for about 10-20 minutes, and the first wafer may be exposed for about 2-4 minutes.

Embodiments also include MEMS devices formed by the above-mentioned MEMS fabrication processes.

Alternative embodiments also include a MEMS device having a wafer, at least one MEMS structure on the wafer, and a hybrid heat/UV-ozone etched organic anti-stiction material layer exposing a structure surface.

BRIEF DESCRIPTION OF THE DRAWINGS

The foregoing and advantages of the invention will be appreciated more fully from the following further description thereof with reference to the accompanying drawings wherein.

It should be noted that the foregoing figures and the elements depicted therein are not necessarily drawn to consistent scale or to any scale. Unless the context otherwise suggests, like elements are indicated by like numerals.

DESCRIPTION OF ILLUSTRATIVE EMBODIMENTS

In exemplary embodiments of the present invention, organic anti-stiction coatings such as, for example, hydrocarbon and fluorocarbon based self-assembled organosilanes and siloxanes applied either in solvent or via chemical vapor deposition, are selectively etched using a UV-Ozone (UVO) dry etching technique in which the portions of the organic anti-stiction coating to be etched are exposed simultaneously to multiple wavelengths of ultraviolet light that excite and dissociate organic molecules from the anti-stiction coating and generate atomic oxygen from molecular oxygen and ozone so that the organic molecules react with atomic oxygen to form volatile products that are dissipated, resulting in removal of the exposed portions of the anti-stiction coating. A shadow mask (e.g., of glass or quartz), a protective material layer, or other mechanism may be used to selective expose the portions of the anti-stiction coating to be UVO etched. Such selective UVO etching may be used, for example, to expose wafer bond lines prior to wafer-to-wafer bonding in order to increase bond shear and adhesion strength, to expose bond pads in preparation for electrical or other connections, or for general removal of anti-stiction coating materials from metal or other material surfaces.

In one specific embodiment, selective UVO etching is performed with two wavelengths of ultraviolet light, one at around 184.9 nm and the other at around 253.7 nm. During UVO etching, organic molecules such as silanes are excited and dissociated by the adsorption of short-wavelength UV radiation. Atomic oxygen is simultaneously generated when molecular oxygen is dissociated by 184.9 nm radiation and ozone is dissociated by 253.7 nm radiation. The 253.7 nm radiation is adsorbed by most organics and also by ozone. The organic molecules react with the atomic oxygen to form volatile products that are dissipated, resulting in removal of the exposed portions of the anti-stiction coating.

Other embodiments may use different wavelengths of ultraviolet light.

In a first exemplary embodiment, a shadow mask is used to selectively expose portions of the anti-stiction-coated structures to the UVO etching.

Figure 1:
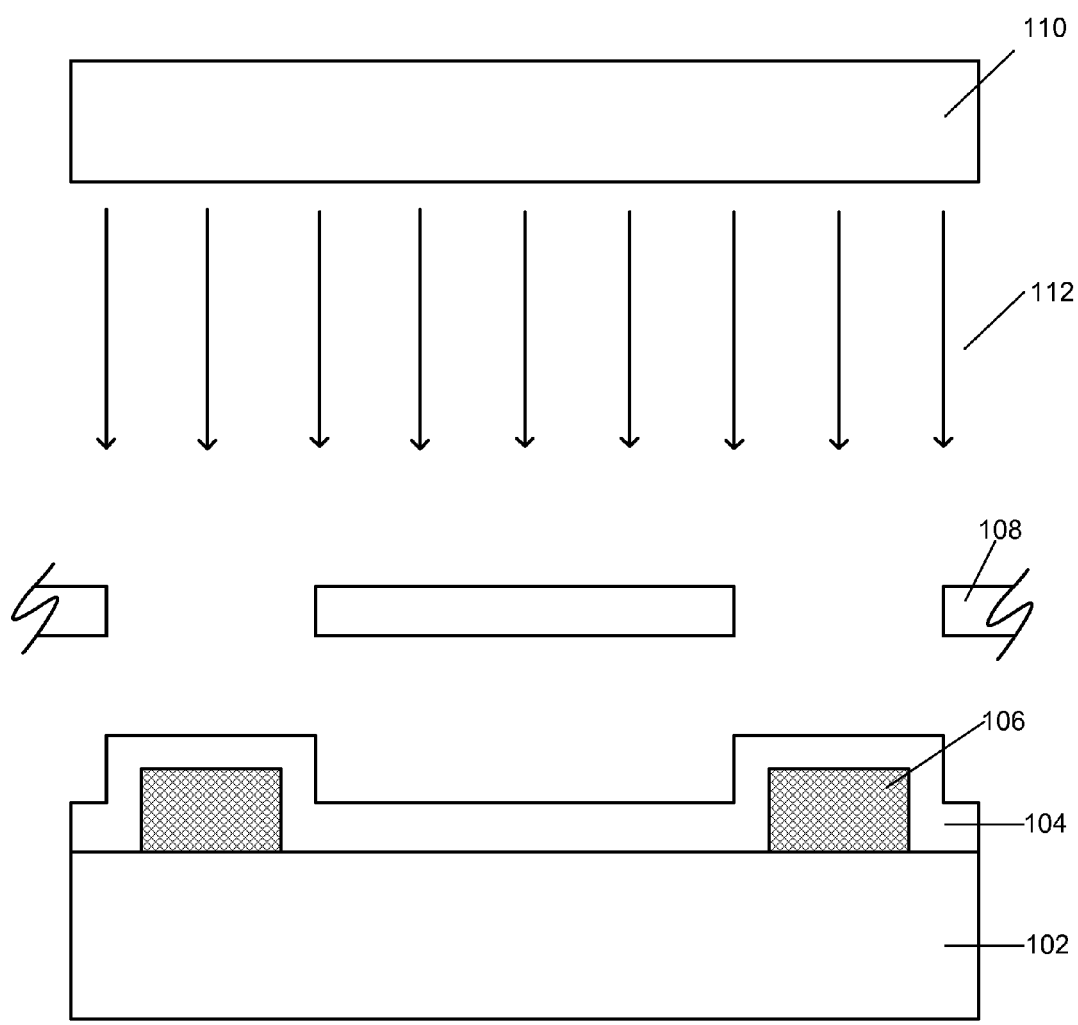
FIG. 1 is a schematic cross-sectional diagram depicting selective UVO etching to expose anti-stiction-coated structures of a MEMS device wafer using a shadow mask, in accordance with an exemplary embodiment of the present invention.

FIG. 1 is a schematic cross-sectional diagram depicting selective UVO etching to expose anti-stiction-coated structures of a MEMS device wafer using a shadow mask, in accordance with an exemplary embodiment of the present invention. Here, the MEMS device wafer includes structures 106 (e.g., wafer bond lines or bond pads) formed on a wafer 102 and covered by an organic anti-stiction coating 104. It should be noted that the MEMS device wafer is greatly simplified, and there can be many layers of structures formed thereon. A shadow mask 108 is positioned between the MEMS device wafer and a radiation source 110 that produces radiation 112 having two wavelengths of light, one around 184.9 nm and the other around 253.7 nm. The shadow mask 108 includes an appropriate arrangement of openings for selectively exposing portions of the anti-stiction coating 104 overlying the structures 106 to the radiation 112. The MEMS device wafer is exposed to the radiation 112 for a sufficient amount of time to etch away the exposed portions of the anti-stiction coating to reveal surfaces of the underlying structures 106.

It should be noted that the shadow mask 108 is not limited to any particular material. Generally speaking, the shadow mask would be made of a material that substantially blocks the wavelengths of light used during the UVO etching of the anti-stiction coating (in an exemplary embodiment, two wavelengths, one around 184.9 nm and the other around 253.7 nm). Exemplary shadow mask materials include glass and quartz. It also should be noted that the openings in the shadow mask may be arranged to account for such things as the distance to the MEMS device wafer and temperature variations during UVO etching. As discussed in U.S. Pat. No. 6,821,561, which is hereby incorporated by reference in its entirety, the shadow mask may expand at elevated process temperatures, and the openings may be arranged to account for the amount of expansion expected at the time of UVO etching.

In a second exemplary embodiment, a protective material layer is used to selectively expose portions of the anti-stiction-coated structures to the UVO etching.

Figure 2:
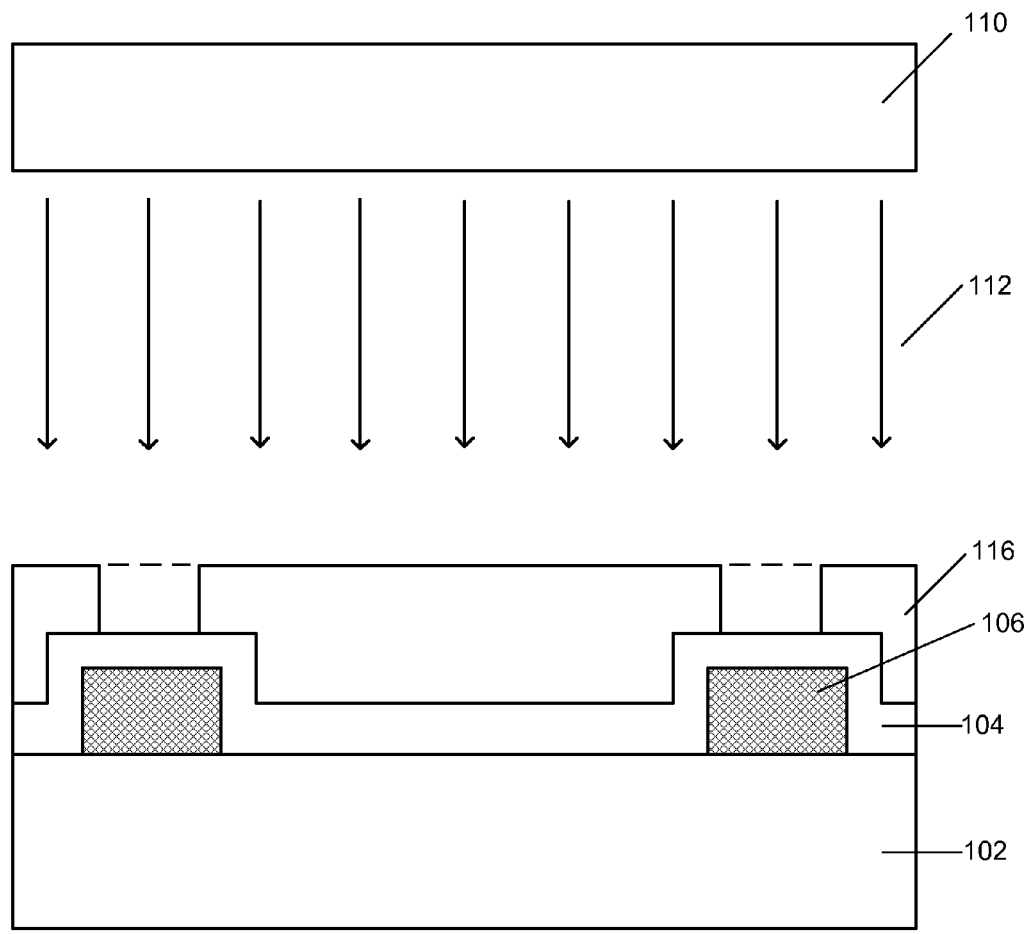
FIG. 2 is a schematic cross-sectional diagram depicting selective UVO etching to expose anti-stiction-coated structures of a MEMS device wafer using a patterned protective material layer, in accordance with an exemplary embodiment of the present invention.

FIG. 2 is a schematic cross-sectional diagram depicting selective UVO etching to expose anti-stiction-coated structures of a MEMS device wafer using a patterned protective material layer, in accordance with an exemplary embodiment of the present invention. As in FIG. 1, the MEMS device wafer includes structures 106 formed on a wafer 102 and covered by an organic anti-stiction coating 104. Here, a protective material layer 116 is formed on the anti-stiction coating 104 and patterned with an appropriate arrangement of openings for selectively exposing portions of the anti-stiction coating 104 overlying the structures 106 to the radiation 112 emitted by radiation source 110. As in FIG. 1, the MEMS device wafer is exposed to the radiation 112 for a sufficient amount of time to etch away the exposed portions of the anti-stiction coating to reveal surfaces of the underlying structures 106. As discussed above, the radiation 112 includes two wavelengths of light, one around 184.9 nm and the other around 253.7 nm. The protective material layer 116 then may be removed.

It should be noted that the protective material layer 116 is not limited to any particular material. Generally speaking, the protective material layer would be made of a material that substantially blocks the wavelengths of light used during the UVO etching of the anti-stiction coating (in an exemplary embodiment, two wavelengths, one around 184.9 nm and the other around 253.7 nm) and can be removed without damaging the underlying anti-stiction coating.

Embodiments that use masking (e.g., a shadow mask, patterned protective material layer, or similar masking) generally add complexity and cost to the fabrication process. For example, shadow masks are relatively expensive to produce and use, must be changed when the product layout changes, must be aligned with the wafer, and can degrade over time depending on the material from which the shadow mask is formed, and the etch quality depends on a number of factors including the quality of the shadow mask, how well the shadow mask is aligned with the wafer, and the distance between the shadow mask and the material to be etched (which may vary at different locations, for example, due to height variances on the surface of the wafer). Protective material layers must be deposited and patterned.

A third exemplary embodiment performs selective UVO etching of the anti-stiction coating without masking through a "hybrid" etching scheme that uses heat followed by UVO without masking. This embodiment may be particularly useful for selective removal of anti-stiction material from metallic (e.g., metal and metal oxide) structures such as bond lines, bond pads, and/or electrodes, while leaving a sufficient amount of anti-stiction coating on silicon structures (e.g., movable MEMS components).

Specifically, after the anti-stiction coating is deposited (typically to a thickness of around 8 to 25 Angstroms), the entire wafer is heated at a predetermined temperature for a predetermined amount of time sufficient remove substantially all of the film from metallic structures while leaving most of the film on silicon structures. Because the anti-stinction coating typically has a weaker (physical) bond to the metallic structures compared to a stronger (chemical) bond to the silicon structures by virtue of the natural existence of rich hydroxyl (—OH) groups on the silicon surfaces, and also because of the higher heat gradient of the metallic structures compared to the silicon structures, the heating process tends to remove the anti-stiction coating more quickly and more completely from the metallic structures. The temperature and heating time therefore are process-specific parameters that generally depend on such things as the type of anti-stiction coating, the thickness of the anti-stiction coating, and the type and thickness of the metallic structures from which the anti-stiction coating is to be removed, among others.

The temperature and heating time parameters may be determined experimentally for a given application, for example, through an iterative process of heating wafers at different temperatures and/or times and measuring the water contact angle or wetting angle for each iteration to determine the appropriate temperature and time at which the anti-stiction coating is removed sufficiently from the metallic structures but not from the silicon structures. For example, the initial water contact angle of the anti-stiction coating may be around 120 degrees, and after heating, the water contact angle may be as low as zero on the metallic structures but may be around 80-90 degrees on the silicon structures, demonstrating removal of substantially all anti-stiction coating from the metallic structures while leaving a sufficient amount of anti-stiction material on the silicon structures. In exemplary embodiments, the temperature is between around 200-460 degrees C. and is typically between around 200-400 degrees C. and in certain embodiments may be between around 200-300 degrees C., and the heating time is typically between around 10-20 minutes and is more typically around 15 minutes.

After the heating process, the wafer surface is top-exposed to UVO for a predetermined amount of time to remove substantially all of the remaining film from the exposed metallic structures while leaving a sufficient amount of film on the silicon structures to retain its anti-stiction properties. Again, the UVO exposure time is a process-specific parameter that may be determined experimentally. In an exemplary embodiment, the UVO exposure time is between around 2-4 minutes and is typically around 3 minutes.

Figure 3:
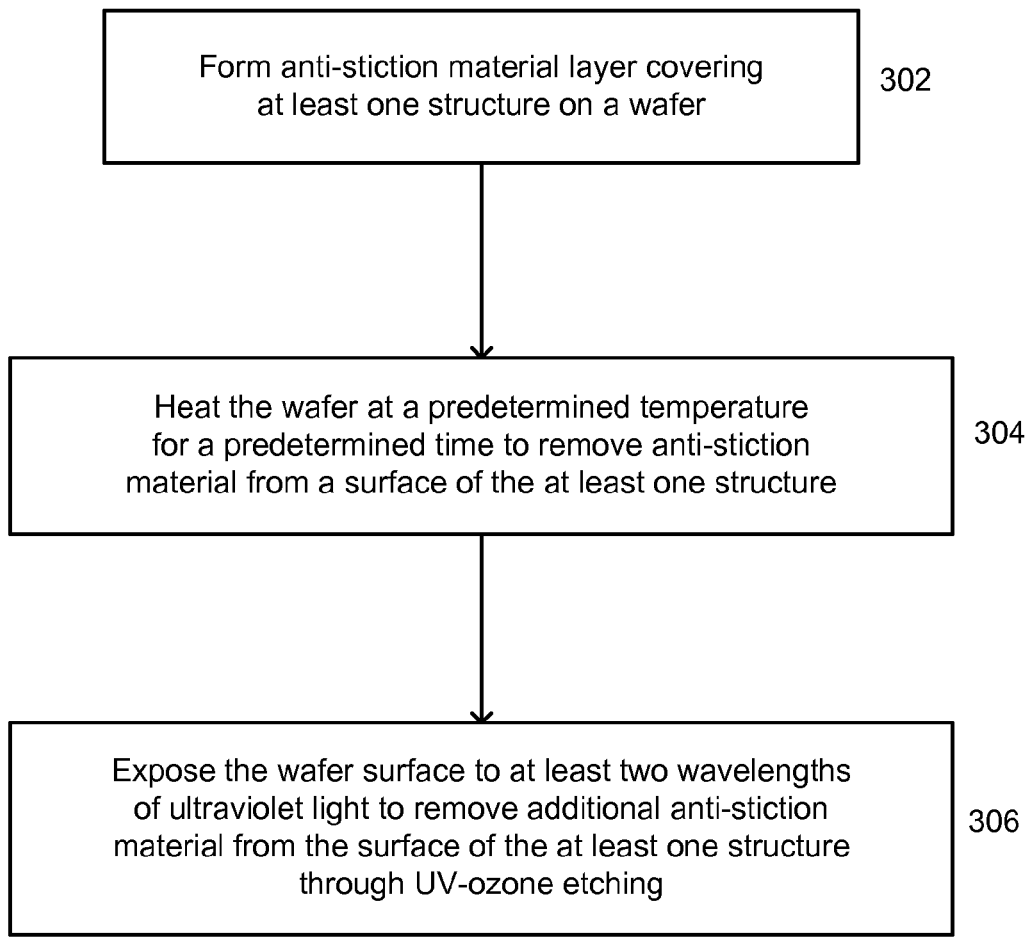
FIG. 3 is a process flow diagram for "hybrid" etching of the anti-stiction coating using heat followed by UVO without masking, in accordance with an exemplary embodiment of the present invention.

FIG. 3 is a process flow diagram for "hybrid" etching of the anti-stiction coating using heat followed by UVO without masking, in accordance with an exemplary embodiment of the present invention. After forming an anti-stiction material layer covering at least one structure on a wafer (e.g., a metallic structure such as a bond line, bond pad, or electrode), in block 302, the wafer is heated at a predetermined temperature (e.g., between around 200-460 degrees C. and typically between around 200-400 degrees C. and in certain embodiments between around 200-300 degrees C.) for a predetermined amount of time (e.g., between around 10-20 minutes and more typically around 15 minutes) to remove anti-stiction material from a surface of the at least one structure, in block 304. Then, the wafer surface is exposed to at least two wavelengths of ultraviolet light for a predetermined amount of time (e.g., between around 2-4 minutes and typically around 3 minutes) to remove additional anti-stiction material from the surface of the at least one structure through UVO etching, in block 306.

It should be noted that masking (e.g., shadow mask or patterned protective material) optionally may be used during the UVO exposure phase of the "hybrid" etching process if needed or desired for a particular application. If used, the parameters for masking (e.g., alignment of a shadow mask) may be less stringent because of the short duration of UVO exposure.

Figure 4:
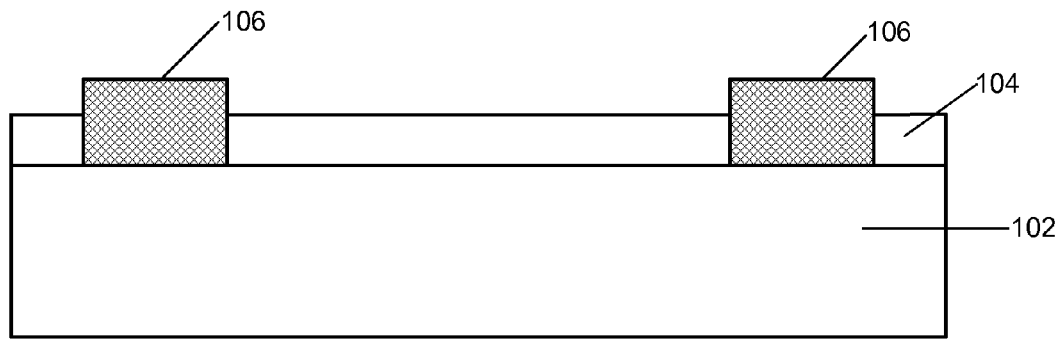
FIG. 4 is a schematic cross-sectional diagram showing a MEMS device wafer after selective UVO etching of the anti-stiction coating to expose the structures.

FIG. 4 is a schematic cross-sectional diagram showing a MEMS device wafer after selective UVO etching of the anti-stiction coating to expose the structures, in accordance with the exemplary embodiments shown in FIGS. 1 and 2. Here, the exposed structures 106 are shown as extending above the etched anti-stiction coating 104, although this is not required, and the exposed structures 106 may be flush with the top surface of the etched anti-stiction coating or may remain recessed below the top surface of the etched anti-stiction coating. It should be noted that surfaces of the structures 106 other than the top surfaces (e.g., a side surface) may be exposed by selective UVO etching, for example, by appropriate configuration and/or orientation of the various components.

After selective UVO etching of the anti-stiction coating to expose the structures, additional fabrication processes may be performed. For example, another material layer may be formed on the exposed surface, an electrical or other connection may be made to the exposed surface, or the exposed surface may be used for wafer-to-wafer bonding such as for wafer capping, stacking, or through-wafer interconnect.

Figure 5:
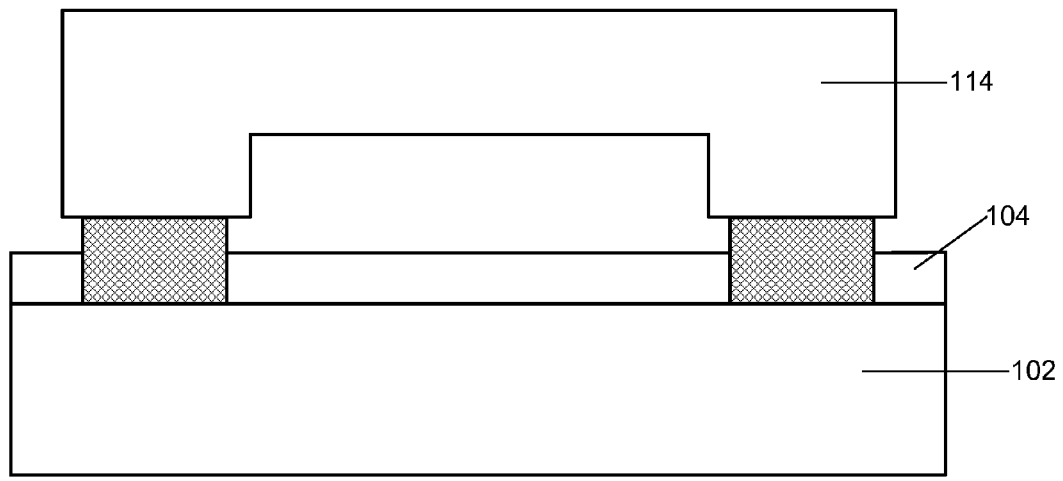
FIG. 5 is a schematic cross-sectional diagram showing the MEMS device wafer of FIG. 4 including a cap bonded to the device wafer via the exposed structures, in accordance with an exemplary embodiment of the present invention.

FIG. 5 is a schematic diagram showing the MEMS device wafer of FIG. 4 including a cap 114 bonded to the device wafer via the exposed structures 106, in accordance with an exemplary embodiment of the present invention. The device and cap wafers may be bonded together, for example, via metal-to-metal, silicon-to-silicon, or silicon-to-metal bonding, to name but a few wafer bonding techniques. Here, the cap 114 includes an indentation on the side facing the device wafer so as to form a cavity within which a movable MEMS structure may be housed, although it should be noted that other types of cap configurations may be used (e.g., the cap could be flat and/or could include openings to allow for exposure of a MEMS structure to the external environment, such as in a MEMS microphone or pressure sensor). It should be noted that the cap 114 may be a blank wafer or may include MEMS structures and/or electronic circuitry such as for an integrated MEMS device.

It should be noted that the present invention is not limited to any particular type of MEMS device. Thus, the MEMS device wafer may include such things as inertial sensors (e.g., capacitive, piezoelectric, and convective accelerometers and vibratory and tuning fork gyroscopes), microphones, pressure sensors, RF devices, and optical devices (e.g., optical switches).

Thus, the present invention may be embodied as a MEMS fabrication method in which an organic anti-stiction material layer is deposited on a first wafer so as to cover at least one structure on the first wafer. The first wafer may be heated to remove substantially all of the anti-stiction material from the structure. Some or all of the anti-stiction material layer may be exposed to UVO etching using at least two wavelengths of ultraviolet light to expose a surface of the structure.

In various alternative embodiments, the organic anti-stiction coating may include a hydrocarbon or fluorocarbon based self assembled organosilanes or siloxanes. The two wavelengths may be at around 184.9 nm and around 253.7 nm. The at least one structure may include a wafer bond line, an electrode, or other structure and may be made of metal or other material.

In certain embodiments, UV-ozone etching may involve the use of a shadow mask, the shadow masking including an arrangement of openings for selective exposure of the anti-stiction coating to the ultraviolet light.

In other embodiments, UV-ozone etching may involve the use of a protective material formed on the anti-stiction material layer and including an arrangement of openings for selective exposure of the anti-stiction coating to the ultraviolet light. The protective material may be removed after UV-ozone etching or may remain on the device.

In still other embodiments, a "hybrid" etching process may use heat followed by UVO exposure without masking.

After UV-ozone etching to expose the surface of the structure, additional fabrication processes may be performed. For example, the exposed surface of the structure may be bonded to a corresponding structure on a second wafer such as a cap wafer, a second MEMS wafer, a wafer with electronic circuitry, or other wafer, and the corresponding structure on the second wafer may be a wafer bond line, an electrode, or other structure and may be made of metal or other material. Alternatively, another material layer may be formed on the exposed surface of the structure, for example, an insulating material, a conductive material, a passivation material, or other material may be formed on the exposed surface of the structure. Alternatively an electrical or other connection may be made to the exposed surface of the structure.

The present invention may also be embodied as a MEMS device formed using any of the processes described above. Exemplary MEMS devices may include such things as inertial sensors (e.g., capacitive, piezoelectric, and convective accelerometers and vibratory and tuning fork gyroscopes), microphones, pressure sensors, RF devices, and optical devices (e.g., optical switches). Such devices often include a number of structures that are released so as to be movable. Examples of released structures include microphone diaphragms and inertial sensor proof masses and shuttles. UV-ozone etching may be used prior to capping or other wafer-to-wafer bonding in order to remove anti-stiction coating from such things as bond lines or electrodes.

Although the above discussion discloses various exemplary embodiments of the invention, it should be apparent that those skilled in the art can make various modifications that will achieve some of the advantages of the invention without departing from the true scope of the invention.

What is claimed is:

1. A MEMS fabrication method comprising:
   forming an organic anti-stiction material layer on a first wafer, the anti-stiction material layer covering a plurality of structures on the first wafer;
   heating the first wafer to remove substantially all anti-stiction material from a surface of a first structure while leaving most of the anti-stiction material on a second structure; and
   exposing the first wafer to at least two wavelengths of ultraviolet light to remove additional anti-stiction material from the surface of the first structure through UV-ozone etching while leaving a sufficient amount of anti-stiction material on the second structure to retain its anti-stiction properties.

2. A method according to claim 1, wherein the organic anti-stiction coating includes at least one of:
   a hydrocarbon-based self-assembled organosilane;
   a hydrocarbon-based self-assembled siloxane;
   a fluorocarbon-based self-assembled organosilane; and
   a fluorocarbon-based self-assembled siloxane.

3. A method according to claim 1, wherein the at least two wavelengths of ultraviolet light include a wavelength of around 184.9 nm and a wavelength of around 253.7 nm.

4. A method according to claim 1, wherein at least one of:
   the first structure includes a wafer bond line;
   the first structure includes an electrode;
   the first structure includes a metallic structure; and
   the second structure includes a silicon structure.

5. A method according to claim 1, wherein UV-ozone etching involves at least one of:
   a shadow mask including an arrangement of openings for selective exposure of the anti-stiction coating to the ultraviolet light; and
   a protective material formed on the anti-stiction material layer, the protective material including an arrangement of openings for selective exposure of the anti-stiction coating to the ultraviolet light.

6. A method according to claim 1, further comprising:
   bonding the exposed surface of the first structure to a corresponding structure on a second wafer.

7. A method according to claim 6, wherein at least one of:
   the second wafer is a cap wafer;
   the second wafer is a second MEMS device wafer;
   the second wafer includes electronic circuitry;
   the corresponding structure is a wafer bond line; and
   the corresponding structure is an electrode.

8. A method according to claim 1, further comprising at least one of:
   forming a material layer on the exposed surface of the first structure; and
   making an electrical or other connection to the exposed surface of the first structure.

9. A method according to claim 1, wherein the first wafer is heated at a temperature about 200-460 degrees C. for about 10-20 minutes, and wherein the first wafer is exposed for about 2-4 minutes.

10. A MEMS device formed by the process comprising:
    forming an organic anti-stiction material layer on a first wafer, the anti-stiction material layer covering a plurality of structures on the first wafer;
    heating the first wafer to remove substantially all anti-stiction material from a surface of a first structure while leaving most of the anti-stiction material on a second structure; and
    exposing the first wafer to at least two wavelengths of ultraviolet light to remove additional anti-stiction material from the surface of the first structure through UV-ozone etching while leaving a sufficient amount of anti-stiction material on the second structure to retain its anti-stiction properties.

11. A MEMS device according to claim 10, wherein the organic anti-stiction coating includes at least one of:
    a hydrocarbon-based self-assembled organosilane;
    a hydrocarbon-based self-assembled siloxane;
    a fluorocarbon-based self-assembled organosilane; and
    a fluorocarbon-based self-assembled siloxane.

12. A MEMS device according to claim 10, wherein the at least two wavelengths of ultraviolet light include a wavelength of around 184.9 nm and a wavelength of around 253.7 nm.

13. A MEMS device according to claim 10, wherein at least one of:
    the first structure includes a wafer bond line;
    the first structure includes an electrode;
    the first structure includes a metallic structure; and
    the second structure includes a silicon structure.

14. A MEMS device according to claim 10, wherein UV-ozone etching involves at least one of:
    a shadow mask including an arrangement of openings for selective exposure of the anti-stiction coating to the ultraviolet light; and
    a protective material formed on the anti-stiction material layer, the protective material including an arrangement of openings for selective exposure of the anti-stiction coating to the ultraviolet light.

15. A MEMS device according to claim 10, further comprising:
    a corresponding structure on a second wafer bonded to the exposed surface of the first structure.

16. A MEMS device according to claim 15, wherein at least one of:
    the second wafer is a cap wafer;
    the second wafer is a second MEMS device wafer;
    the second wafer includes electronic circuitry;
    the corresponding structure is a wafer bond line; and
    the corresponding structure is an electrode.

17. A MEMS device according to claim 10, further comprising at least one of:
    a material layer disposed on the exposed surface of the first structure; and
    an electrical or other connection to the exposed surface of the first structure.

18. A MEMS device according to claim 10, wherein the first wafer is heated at a temperature about 200-460 degrees C. for about 10-20 minutes, and wherein the first wafer is exposed for about 2-4 minutes.

19. A MEMS device comprising:
    a wafer;
    a plurality of MEMS structures on the wafer; and
    a hybrid heat/UV-ozone etched organic anti-stiction material layer exposing a surface of a first structure while leaving a sufficient amount of anti-stiction material on a second structure to retain its anti-stiction properties.

* * * * *